United States Patent [19]

van de Meeberg et al.

[11] 4,344,149
[45] Aug. 10, 1982

[54] DECIMATION, LINEAR PHASE, DIGITAL FIR FILTER

[75] Inventors: Leendert van de Meeberg; Daniël J. G. Janssen, both of Eindhoven, Netherlands

[73] Assignee: U.S. Philips Corporation, New York, N.Y.

[21] Appl. No.: 166,888

[22] Filed: Jul. 8, 1980

[30] Foreign Application Priority Data

Jul. 9, 1979 [NL] Netherlands .......................... 7905332

[51] Int. Cl.³ ............................................. G06F 15/31
[52] U.S. Cl. .................................................... 364/724
[58] Field of Search ......................................... 364/724

[56] References Cited

U.S. PATENT DOCUMENTS 3,988,607 10/1976 Eggermont et al. ................. 364/724
3,997,773 12/1976 Van Essen et al. ............. 364/724 X
4,020,332 4/1977 Crochiere et al. .............. 364/724 X

OTHER PUBLICATIONS

J. R. Bennett et al., "On the Characteristics of a Simple Architecture for Finite Impulse Response Digital Filtering", IEEE Transactions on Computers, vol. C-27, No. 12, Dec. 1978, pp. 1197-1202.

M. G. Bellanger et al., "Premultiplication Scheme for Digital FIR Filters with Application to Multirate Filtering", IEEE Transactions on Acoustics, Speech, and Signal Processing, vol. ASSP-26, No. 1, Feb. 1978, pp. 50-55.

Primary Examiner—Jerry Smith
Attorney, Agent, or Firm—Thomas A. Briody; William J. Streeter; Edward W. Goodman

[57] ABSTRACT

Decimation non-recursive digital linear phase FIR filter having a length N and a decimation factor q, comprising a first and a second digital delay line, both consisting of a cascade arrangement of a number of auxiliary delay lines each having a time delay qT. An individual distribution line is connected to the input of each of the delay lines as well as to the output of each of the auxiliary delay lines. Digital input signal components occurring with a period T are applied to the input of the first digital delay line and each auxiliary delay line contains q of these components. These two delay lines are coupled to one another by means of a sequence reversing device which comprises a store having a capacity of q signal components. This reversing device applies, in the next control interval, q input signal components, produced in a given control interval of length qT by the first delay line, in reversed order to the second delay line. Every two distribution lines which are arranged symmetrically relative to a symmetry line being connected to inputs of an adder device the output of which is connected to an input of an accumulation device via a multiplying device. A sequence of filter coefficients being applied to the multiplying device. The accumulation device now produces the sum of all products formed in a control interval.

5 Claims, 10 Drawing Figures

DECIMATION, LINEAR PHASE, DIGITAL FIR FILTER

A. BACKGROUND OF THE INVENTION

A(1) Field of the invention

The invention is used in the field of digital signal processing and relates more particularly to a decimation, non-recursive linear phase FIR filter having a filter length N and a decimation factor q.

A decimation filter is a filter belonging to the category of filters arranged to change the sampling frequency associated with a digital signal and to adapt the frequency spectrum of the original digital signals to this changed sampling frequency. The original sampling frequency is reduced by the decimation factor q.

In such a filter precautions must be taken to prevent "aliasing" from occurring (see chapter D, reference 1).

The filter length N of the filter indicates the number of filter coefficients considered. This filter length determines the extent to which unwanted frequency components are suppressed and consequently the extent to which "aliasing" is prevented.

In a linear phase FIR filter the impulse response characterized by the N filter coefficients is symmetrical and finite.

A(2) Description of the prior art

As mentioned above a decimation filter is arranged to reduce the sampling frequency of a digital information signal by a factor of q, such that no aliasing occurs. Let it be assumed that this information signal is formed by a sequence of information signal samples x(n) which occur with the said sampling frequency, which will be denoted by 1/T. The quantity n in x(n) represents the number of the information signal sample, it holding that $n = 0, \pm 1, \pm 2, \ldots$ Different embodiments of a decimation filter are known.

A first embodiment is described in reference 2 and comprises a digital filter whose output is connected to a switching device. The digital information signal is applied to the digital filter and this filter produces a digital auxiliary signal formed by a sequence of signal samples z(n), which also occur with the sampling frequency 1/T. These signal samples z(n) are applied to the switching device, which only passes those signal samples z(n) for which it holds that: $n = iq$, wherein $i = 0, \pm 1, \pm 2, \ldots$ Thus, a digital output signal consisting of a sequence of output signal samples y(i), which occur with the desired sampling frequency 1/(qT) and for which it holds that $y(i) = z(iq)$, appears at the output of the switching device.

This first embodiment of the decimating filter has the drawback that the signal samples z(n) which are not passed by the switching device are yet computed, which causes the internal processing speed to be really unnecessarily high.

Reference 3 proposes a second embodiment. In this second embodiment a considerably lower internal processing speed is required than in the first embodiment. This second embodiment comprises a digital filter whose input is connected to the output of an input buffer wherein, depending on the construction of the digital filter, q or q−1 consecutive information signal samples x(n) are stored. These signal samples x(n) stored in this input buffer are transferred to the digital filter in a time interval which is at the utmost equal to one sampling period T. This digital filter now has a time interval of a length $q(-1)T$ at its disposal to compute one output signal sample y(i). This second embodiment has the drawback that it requires a high clock frequency to transfer the signal samples stored in the input buffer to the digital filter.

The digital filters used in the above-described embodiment are preferably implemented as non-recursive digital FIR filters. These FIR filters now determine predominantly the complexity of the decimation filter. Two structures are of main importance for non-recursive digital filters.

A first FIR filter is shown in, for example FIG. 9.1 of reference 4 and is sometimes denoted as a tapped delay line filter. This FIR filter comprises a digital delay line in the form of a cascade arrangement of a plurality of shift register sections, each of these sections being arranged for storing one signal sample x(n) and having, consequently, a delay time T. Each one of the outputs of these shift register sections are connected to the input of an adder device via a multiplier. A filter coefficient is applied to each of these multipliers.

A second FIR filter structure is shown in, for example, FIG. 9.2 of reference 4. This FIR filter comprises a circulating delay line which is a circulating shift register comprising a cascade arrangement of N shift registers, each having been arranged for storing one signal sample x(n). These signal samples are applied consecutively and together with an associated filter coefficient to a multiplier device producing product signal samples which are applied to an accumulator.

Relative to the first FIR filter structure, the second FIR filter structure has the advantage that it requires only one multiplier device. The drawback is, however, that in this second structure the frequency with which the signal samples stored in the shift register must be shifted is now N-times higher than the frequency 1/T with which these signal samples are applied to this shift register.

If a linear phase FIR filter must be realized, it is possible to reduce the typical drawback of the first FIR filter structure as well as the typical drawback of the second FIR filter structure. In these circumstances it is possible to choose the value of N such that the filter coefficients are equal pair-wise. The signal samples which must now be multiplied by equal filter coefficients can now first be added together, so that approximately N/2 multiplications need not be performed.

The first FIR filter structure can now be simplified to the structure shown in FIG. 10 of reference 5 and in which approximately N/2 of the originally present multipliers have been replaced by adders, which makes the whole structure less complex.

The second FIR filter structure can now be modified to form one of the structures shown in the FIGS. 3 to 11 inclusive of reference 6. In the structures shown there it is achieved that the frequency with which the signal samples are shifted in the shift register is lower than in the original structure. The complexity of the linear phase FIR filter structures obtained in this manner is, however, generally greater than the complexity of the non-linear phase FIR filter structures comprising a circulating delay line.

B. SUMMARY OF THE INVENTION

It is an object of the invention to provide a novel concept of a decimation digital linear phase FIR filter in which use is made in known manner of the symmetry in the impulse response and which is particularly suitable for implementation as an "Integrated Circuit" (IC) because of its very low internal processing speed and by its regular structure.

According to the invention this decimation, non-recursive linear phase FIR filter of the length N and having decimation factor q, whereby N and q are integers, comprises:

a filter input to which components of a digital input signal are applied at a rate 1/T, and a filter output;

a first digital delay line connected to the filter input;

a second digital delay line, each of these delay lines being formed by a cascade arrangement of a number of auxiliary delay lines each having a delay time qT, an individual distribution line being connected to the input of each of these delay lines as well as to the output of each of the auxiliary delay lines;

a control circuit for generating first and second control pulses, every two consecutive first control pulses limiting a control interval having a length qT;

a sequence reversing device for coupling the output of the first digital delay line to the input of the second digital delay line and comprising storage means and being controlled by the said first control pulses for storing those q components which occur sequentially in a given control interval at the output of the first digital delay line and for applying sequentially and in reversed order these q components to the input of the second digital delay line, in the next control interval;

first adder means;

means for coupling distribution lines which are symmetrical arranged relative to a symmetry line, to the first adder means for forming sum components;

means for producing in each control interval a number of filter coefficients;

multiplier means coupled to the first adder means and to the filter coefficients-producing means for generating product components, each one of which is formed by the product of a sum component and a filter coefficient associated therewith;

second adder means for adding together the product components generated in a control interval;

means which are controlled by the said second control pulses for periodically coupling, with a period qT, the filter output to the second adder means.

D. REFERENCES

1. Terminology in Digital Signal Processing; L. R. Rabiner, et al.; IEEE Transactions on Audio and Electroacoustics, Vol. Au-20, No. 5, December 1972, pages 322–337.
2. Arrangement for converting discrete signals into a discrete single-sideband frequency division multiplex signal and vice versa; Netherlands Patent Application No. 77,03633, U.S. Pat. No. 4,131,764.
3. Non-recursive digital filter with reduced output sampling frequency; Netherlands Patent Application No. 74,16479, U.S. Pat. No. 4,204,177.
4. Theory and application of digital signal processing; L. R. Rabiner, B. Gold; Prentice-Hall, Inc. 1975.
5. Designing Simple Effective Digital Filters; D. W. Tufts, et al.; IEEE Transactions on Audio and Electroacoustics, Vol. AU-18, No. 2, June 1970, pages 142–158.
6. Hardware Considerations for Digital FIR-Filters Especially with Regard to Linear Phase; U. Heute; Archiv für Elektronik und Uebertragungstechnik (AEU), Band 29, (1975) Heft 3, pages 116–120.

E. DESCRIPTION OF THE EMBODIMENTS

E(1) Introduction

Figure 1:
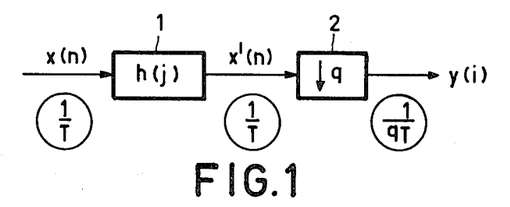
FIG. 1 is a symbolic representation of a decimation filter as indicated in reference 2.

In this paragraph the basic idea of the decimation digital filter according to the invention will be explained. To this end FIG. 1 is a symbolic representation of the decimating filter shown in reference 2. This decimation filter comprises a digital filter 1 having an impulse response h(j) with length N. A digital signal $\{x(n)\}$, whose components x(n) occur with a frequency 1/T is applied to this digital filter 1. This digital filter now produces components x'(n) of a digital signal $\{x'(n)\}$ with a rate which is also equal to 1/T. For these components it holds that:

$$x'(n) = \sum_{j=0}^{N-1} h(j) x(n-j) \qquad (1)$$

In expression (1) it holds that: n=0, ±1, ±2, ...

The digital signal $\{x'(n)\}$ is now further applied to an element 2 denoted switching device in the foregoing but denoted SRR element (SRR=Sample Rate Reduction) in reference 2. The quantity q indicated in the element 2 is an integer and represents the reduction factor of the sampling frequency. This SRR element operates as follows. Each time one component out of q components of the sequence of components x'(n) is passed by this element, whereas the other components are suppressed. Thus, it produces components y(i) of a digital output signal $\{y(i)\}$ with a frequency 1/qT. The operation of this SRR element can be mathematically described by means of the expression:

$$y(i) = x'(iq) \qquad (2)$$

From (1) and (2) it now follows that:

$$y(i) = \sum_{j=0}^{N-1} h(j) x(iq-j) \qquad (3)$$

The invention is now based inter alia on the following underlying notion. By subdividing the set of N filter coefficient h(j) into N/q sub-sets, each having q filter coefficients which may then be denoted by h(kg+m), expression (3) can now be written:

$$y(i) = \sum_{m=0}^{q-1} \sum_{k=0}^{\frac{N}{q}-1} h(kq + m) x(iq - kq - m) \quad (4)$$

In expression (4), k represents the number of the sub-sets and m the number of the filter coefficient within the sub-set.

Implementation of expression (4) furnishes a decimation filter in which the whole period qT is utilized for computing a component y(i).

For completeness it should be noted that if h(j) represents a symmetrical impulse response, it then holds for N is even that:

$$h(j) = h(N-1-j) \text{ wherein } j = 0, 1, 2, \ldots N/2-1 \quad (5).$$

E(2). The preferred embodiment

A particularly advantageous implementation of the decimation digital FIR filter defined mathematically in expression (4) is obtained by choosing the variable m in expression (4) equal to q−r, wherein r=1, ... q. Expression (4) then changes into:

$$y(i) = \sum_{k=0}^{\frac{N}{q}-1} \sum_{r=1}^{q} H(kq + q - r) x(iq - kq - q + r) \quad (6)$$

Figure 2:
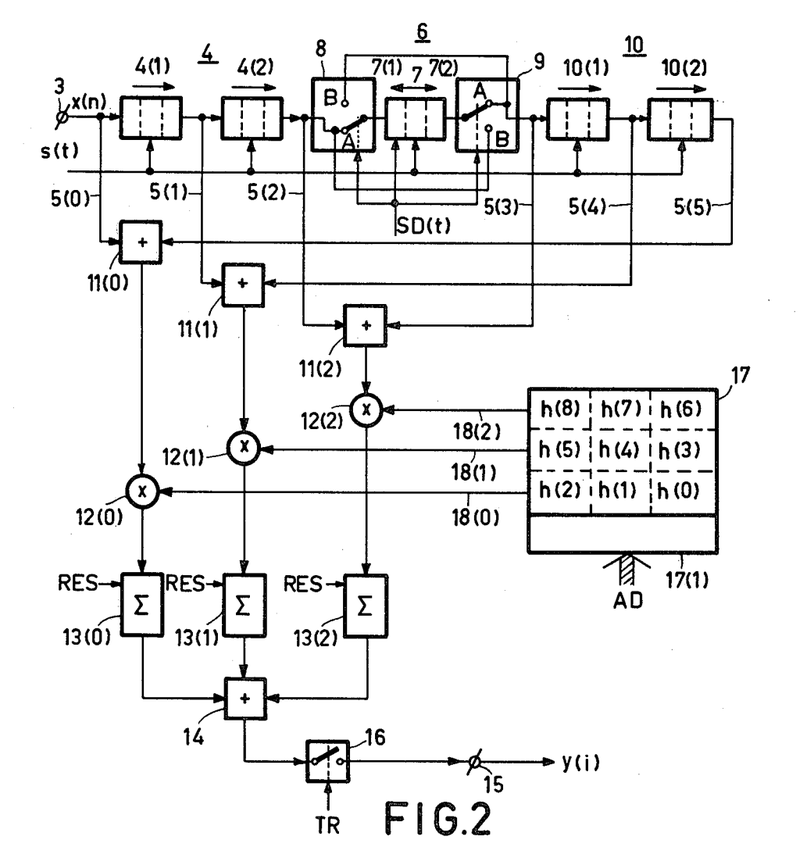
FIG. 2 shows a first embodiment of a decimation, digital linear phase FIR filter according to the invention, whereby the filter length N is even.

FIG. 2 shows an implementation of the decimation digital FIR filter defined mathematically in expression (6). It is assumed that the filter length N is even and that its impulse response satisfies expression (5), so that this filter has a linear phase characteristic. This filter comprises an input 3 to which components x(n) of a digital input signal {x(n)} are applied with a rate 1/T. These components, which may contain one or several bits, are applied to a first digital delay line 4, which is provided by a cascade arrangement of (N−2q)/2q auxiliary delay lines 4(1) and 4(2). In the embodiment shown N=18 and q=3, so that (N−2q)/2q=2. Each one of the two auxiliary delay lines 4(1) and 4(2) are constructed as "forward shift register" which must be understood to mean a shift register whose content can only be shifted into one direction. In the Figure, this direction of shift of these forward shift registers 4(1) and 4(2) are indicated by means of an arrow above the elements. Each one of these shift registers 4(1) and 4(2) comprises q shift register sections which are each arranged to store a component of the digital input signal. Shift pulses s(t) which occur with a rate 1/T are applied to each of these shift registers, so that the delay time of such a forward shift register is equal to qT. A distribution line 5(0) is connected to the input of this delay line 4, a distribution line 5(1) is connected to the output of the register 4(1) and a distribution line 5(2) is connected to the output of the register 4(2).

The output of the register 4(2) is also connected to the input of a sequence reversing device 6 which, in this embodiment, is an invertable shift register 7 arranged between two switching devices 8 and 9, shown symbolically, which each have a switching contact A and a switching contact B. The shift register 7 as well as the forward shift registers 4(1) and 4(2) comprise q shift register sections, each arrange to store a component of a digital signal applied to this shift register 7. The shift register 7 and the switching devices 8 and 9 are so controlled by a control signal SD(t) that, when this shift register 7 functions as forward shift register, it is connected to the two switching contacts A in the manner shown in the Figure. If, on the contrary, this shift register 7 functions as a backward register, it is connected to the two switching contact B. The switching contact B of switching device 8 is connected to switching contact A of switching device 9. Inversely, switching contact B of switching device 9 is connected to switching contact A of switching device 8. Last-mentioned switching contact is also connected to the output of the forward shift register 4(2). The output of this inverting device 6 is connected to the switching contact A of switching device 9.

To the output of the sequence reversing device 6 there is connected a second digital delay line 10, which is of a similar construction as the delay line 4, and which, because N is even, also comprises two forward shift registers 10(1) and 10(2) which are each arranged to store q digital components and to which the distribution line 5(3), 5(4) and 5(5) are connected.

As in this embodiment a symmetry line can be defined located between the distribution lines 5(2) and 5(3), the distribution lines 5(0) and 5(5) are connected to inputs of an adder device 11(0), the distribution lines 5(1) and 5(4) are connected to inputs of an adder device 11(1) and the distribution lines 5(2) and 5(3) are connected to inputs of an adder device 11(2). Each of these adder devices produces the sum of the digital signal components which are simultaneously applied thereto.

Each of these adder devices 11(.) has its output connected respectively to the input of a resettable accumulator 13(.) via a multiplier device 12(.). Each one of these three accumulators 13(0), 13(1) and 13(2) each comprising a resetting input RES, has an output connected to inputs of an adder device 14, which produces a digital signal component y(i) which is applied to the filter output 15 and a predetermined instant. In the embodiment shown this is schematically represented by the symbolically shown switch 16 arranged between the output of the adder device 14 and the filter output 15.

A sequence of q filter coefficients is applied to each of the multiplier devices 12(.). Each of these sequences is generated by a storage medium 17, for example a ROM, whose storage locations are addressable. To that end the storage medium comprises an address decoder 17(1) to which address code AD are applied with a rate 1/T. To apply the required filter coefficients to the multiplier devices 12(0), 12(1), 12(2), this storage medium comprises N/2q outputs which, in the present case, works out in 3 outputs, namely the outputs 18(0), 18(1), 18(2). In response to an address code applied to the address decoder 17(1) this storage medium 17 supplies a filter coefficient at each of its output. In response to consecutive address codes, the filter coefficients h(kq+q−r) occur consecutively at the output 18(0), it holding that: K=0 and r=1, 2, 3, ... q. Those filter coefficients h(kq+q−r) for which it holds that: k=1 and r=1, 2, 3, q, etc. occur, one after the other, at the output 18(1).

Figure 3:
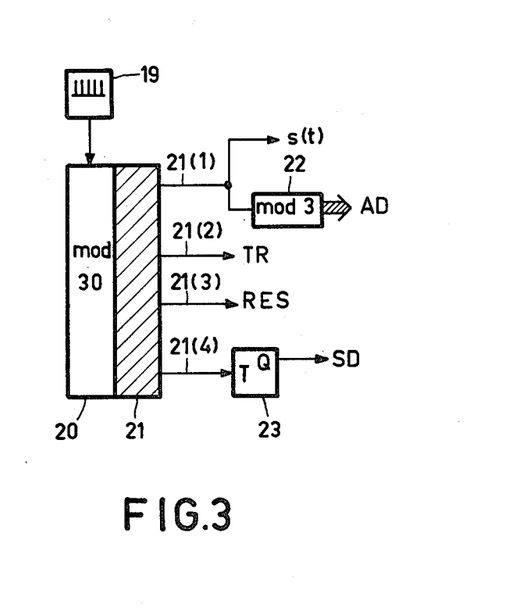
FIG. 3 shows a control circuit for controlling the digital filter in FIG. 2.
Figure 4:
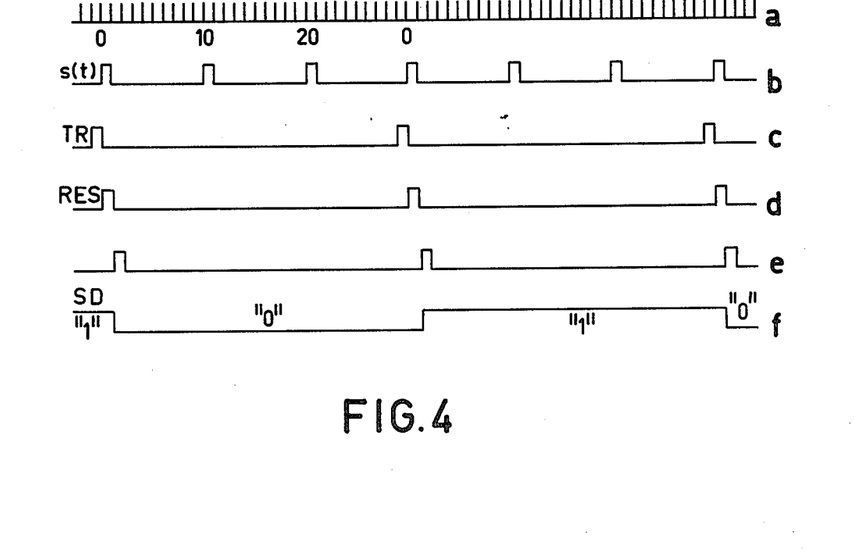
FIG. 4 shows some pulse signals generated by the control circuit shown in FIG. 3.

To generate the control pulses s(t), the control signal SD(t) controlling the register 7 and the circuit switching devices 8 and 9, and also to generate the address code for the address decoder 17(1), the control circuit shown in FIG. 3 may, for example, be used. This control circuit comprises a clock pulse generator 19 which produces the sequence of clock pulses shown at a in FIG. 4. These clock pulses, which have a period T/30 are applied to a modulo-30-counter 20, to which a decoding network 21, which comprises four outputs 21(.) is connected. Each time the counter 20 is in the counting positions 0, 10 and 20, the output 21(1) produces a pulse having a pulse duration T/30. The sequence of pulses thus occurring at the output 21(1) is shown at b in FIG. 4, these pulses being the shift pulses s(t) which are applied to the shift register sections 4(1), 4(2), 7, 10(1), 10(2). These shift pulses s(t) are also applied to a modulo-3-counter 22, which is connected to the output 21(1) and whose counting position is applied as address code AD to the address decoder 17(1) of the storage medium 17. A pulse having a pulse duration T/30 occurs at the output 21(2) each time the counter 20 has the counting position 29. The pulses thus obtained, which will be indicated by TR, are shown at c in FIG. 4 and are applied to the switching device 16. At that instant the number produced by the adder 14 is applied to the output 15 of the filter. A pulse having a pulse duration T/30 occurs at the output 21(3) of the decoding network 21, each time the counter 20 is in the counting position 0. These pulses, which will be denoted by RES are shown at d in FIG. 4 and are applied to the reset inputs of the accumulators 13(.), causing the accumulators to be reset to the zero position. A pulse having pulse duration T/30 occurs at the output 21(4) each time the counter 20 has the counting position 1. The interval limited by two of these pulses occurring in succession will be denoted the control interval. The pulses thus obtained are shown at e in FIG. 4 and are applied to a T-flip-flop 23, whose Q-output supplies, in response to these pulses, the pulses SD shown at f in FIG. 4, which are applied to the sequence reversing device 6. More particularly, the reversable shift register 7 in this inverter device 6 is connected to the two contacts A and it functions as forward shift register when SD has the logic value "1". If, on the contrary, SD has the logic value "0", then the invertable shift register 7 is connected to the two contacts B and functions as backward shift register.

E(3) Operation of the preferred embodiment

Figure 5:
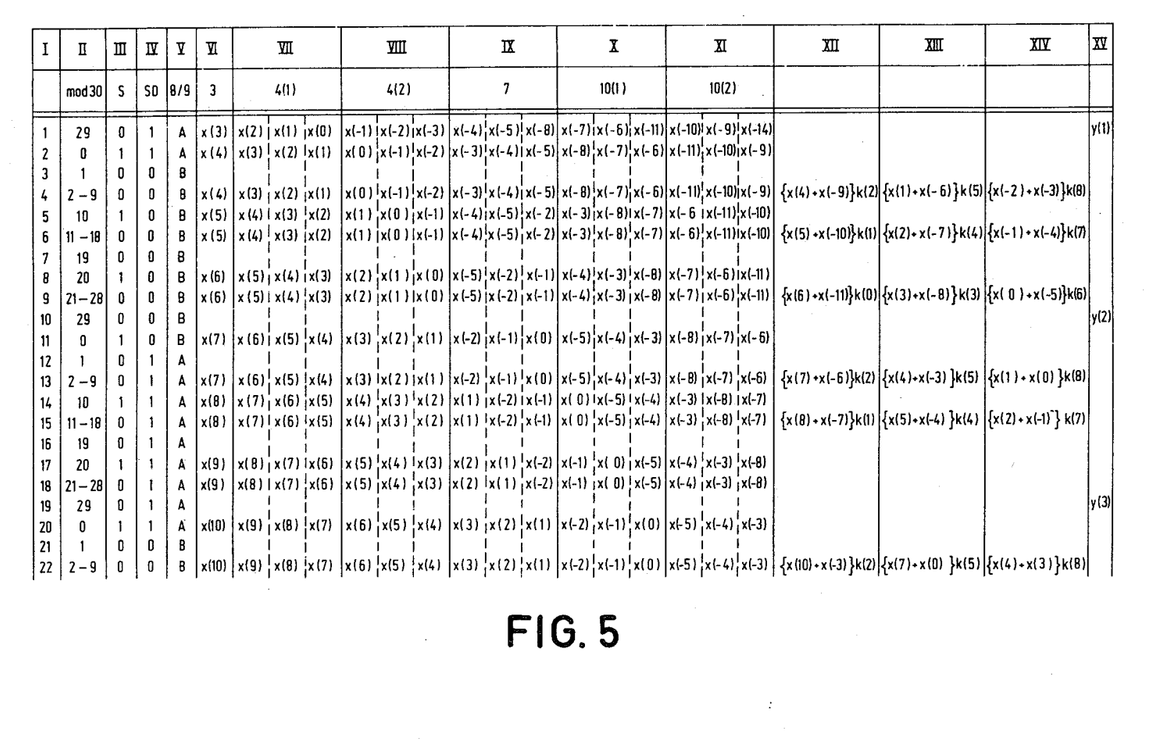
FIG. 5 is a Table to explain the operation of the digital filter shown in FIG. 2.

The operation of the decimation digital filter shown in FIG. 2 will be further explained with reference to FIG. 5. The Table shown in FIG. 5 comprises 15 columns denoted by I, II, III, . . . XV, respectively, as well as 22 rows denoted by 1, 2, 3, . . . 22 and whose numbers are included in column I. Column II shows the counting positions of the modulo-30-counter 20; column III shows by means of 0 that no shift pulse is present and by 1 that this shift pulse is present. Column IV shows the logic values of SD and column V indicates to which switching contacts, A or B, the invertable shift register 7 is connected. Column VI shows the digital signal component at the input 3. The columns VII to XI inclusive represent the contents of shift registers 4(1), 4(2), 7, 10(1) and 10(2), respectively. The columns XII, XIII, XIV, respectively, show the products produced by the multipliers 12(0), 12(1) and 12(2), whereas column XV shows the number of the output signal component of the filter.

The operation of the decimation filter will be described on the basis of the situation shown in the first row of FIG. 5 wherein the counter 20 is in the counting position 29. The number y(1) produced by the adder 14 at this instant is now applied to the output 15 of the filter via the switching device 16. In response to the next clock pulse, counter 20 arrives in the counting position 0, causing the accumulators 13(.) to be reset to the zero position and a shift pulse to occur which shifts the content of all shift registers one shift register section. The shift register content thus obtained is shown in row 3. If now the counter 20 arrives in the counting position 1, SD becomes equal to zero and the register 7 is connected to the switching contact B without any change in the content of the register. In the time interval in which the modulo-30-counter 20 passes through the counting positions 2 to 9 inclusive, the three multipliers 12(.) produce the product shown in row 4 of the columns XII, XIII, XIV, these products being applied to the relevant accumulator. In response to the tenth clock pulse the decoding network 21 applies a shift pulse to all the shift registers. The content of the shift registers, obtained in response to this shift pulse, is shown in row 5. In the time interval in which the modulo-30-counter 20 passes through the counting positions 11 to 18 inclusive, the three amplifiers 12(.) produce the products shown in row 6 of columns XII, XIII, XIV, which are again applied to the relevant accumulators. In response to the nineteenth clock pulse the modulo-30-counter 20 assumes the counting position 19. In this counting position the filter is not active. In response to the twentieth clock pulse the decoding network 21 applies a shift pulse to all shift registers. The content of the shift register obtained in response to this shift pulse is shown in row 8. In the time interval in which modulo-30-counter 20 passes through the counting positions 21 to 28 inclusive, the three multipliers 12(.) produce the products shown in row 9 of the columns XII, XIII, XIV, which are applied to the relevant accumulator. If thereafter the counter 20 assumes the counting position 29, the adder 14 produces the output signal component y(2) which is equal to the sum of the products shown in the rows 4, 6 and 9 of the columns XII, XIII and XIV. The component thus obtained is applied to the filter output 15 via the switching device 16.

As shown in row 11 the counting position 29 of the modulo-30-counter 20 passes, in response to a further clock pulse, to the counting position 0 in response to which the decoding network 21 applies a shift pulse to all shift registers. If now counter 20 again assumes the counting position 1, the value of SD changes and becomes "1", so that the register 7 is connected to the two switching contacts A. At further clock pulses the behaviour of this decimation filter is fully analogous to the foregoing.

E(4) Alternative embodiments

In the embodiment of FIG. 2 each one of the auxiliary delay lines 4(1) and 4(2), as well as 10(1) and 10(2) is a "forward shift register" and the sequence inverting device 6 is an invertable shift register 7, which is connected to the auxiliary delay line 4(2) and 10(1) by means of two switching devices 8 and 9.

Figure 6:
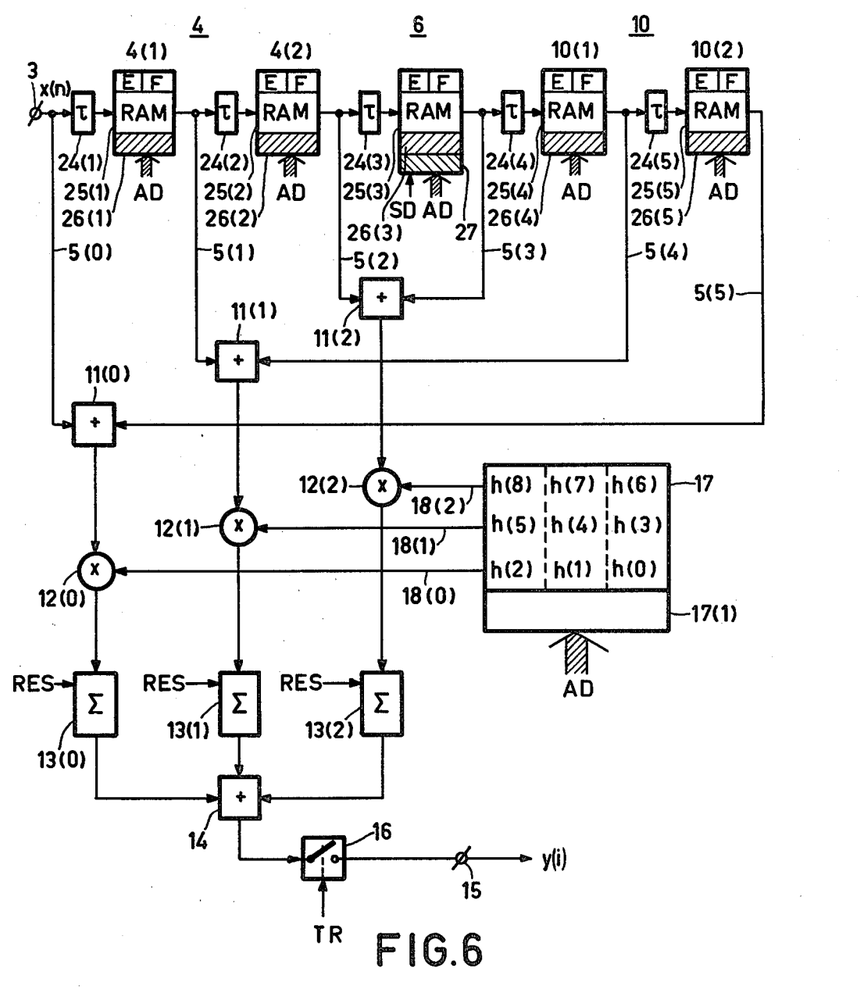
FIG. 6 shows a second embodiment of a decimation, digital linear phase FIR filter according to the invention.

FIG. 6 shows an alternative embodiment of the decimation digital filter shown in FIG. 2. This digital filter shown in FIG. 6 is predominantly of the same construction as the digital filter shown in FIG. 2. Now, however, each of the auxiliary delay lines 4(1), 4(2), 10(1) and 10(2) and the sequence inverting device 6 are provided by a cascade arrangement of a buffer 24(.) and a storage means with addressable storage locations 25(.). As shown in the Figure, let it now be assumed that each of these storage means is a RAM in which q digital signal components are stored. Each of these storage means comprises an address decoder 26(.) to which the address code AD, which is also applied to the storage means 17, is applied. Furthermore, these storage means comprise a write circuit E and a read circuit F.

The cascade arrangement of buffer and RAM operates as follows. Each time a pulse is applied to the read circuit F of the RAM 25(.) the content of the storage location addressed by the address code is applied to the adder 11(.) and to the buffer 24(.+1) of the subsequent cascade arrangement and stored there. If thereafter a pulse is applied to the write circuit E of the RAM 25(.+1), the content of the buffer 24(.+1) is transferred to this RAM and stored in that storage location which is addressed at that instant by the address code.

Figure 7:
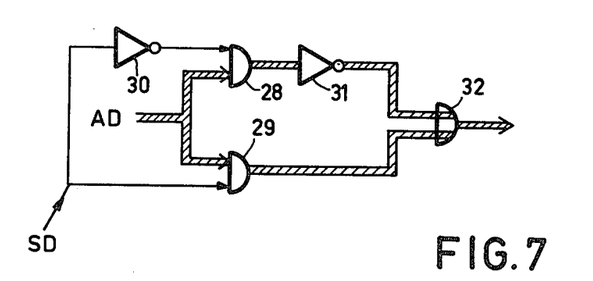
FIG. 7 shows a circuit for converting an address code into its 1-complement form.

In order to have the buffer 24(3) and the RAM 25(3) function as a sequence reversing device, the address code AD is not applied directly to the address decoder 26(3) but via a circuit 27 which is controlled by the pulses SD and which converts the address code into its 1-complement each time SD=0 and applies the address code thus obtained to the address decoder. If, however, SD=1, the address code is applied directly to the address decoder 26(3). FIG. 7 shows an embodiment of the circuit 27 which comprises two AND-gate circuits 28 and 29, the multi-bit address code AD being applied to each of these gate circuits. The AND-gate circuit 29 also receives the pulse SD and the AND-gate circuit 28 receives the logic inverted value of SD obtained by means of an inverter 30. If now SD=0, the AND-gate circuit 28 produces the multi-bit address code AD which is thereafter applied to the inverter circuit 31, which logically inverts all bits of the address code AD and thus produces the original address code AD in 1-complement. The address code thus obtained is applied to an OR-gate circuit 32. If SD=1, the AND-gate 29 produces multi-bit address code AD, which is now applied directly to the OR-gate circuit 32.

Figure 8:
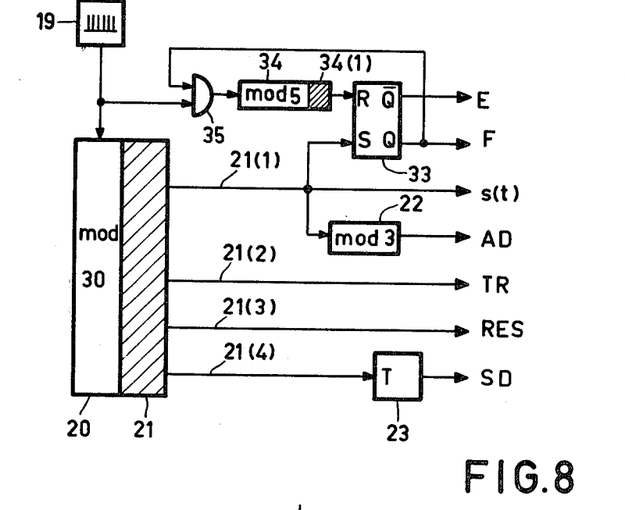
FIG. 8 shows a modification of the control circuit shown in FIG. 3 and used for controlling the digital filter shown in FIG. 6.

The control circuit shown in FIG. 8 may be used to control this digital filter. This control circuit is essentially similar to the control circuit shown in FIG. 3 but, to generate pulses which must be applied to the read circuits F and the write circuits E of the different RAM's, it is provided with an RS flipflop 33 to whose S-input the pulses SD are applied. Pulses which are taken from a decoding network 34(1), which is connected to a modulo-5-adder 34, are applied to the R-input of this flip-flop 33. This decoding network 34(1) produces an output pulse each time this counter 34 reaches its highest counting position. Those clock pulses which occur in the period during which the RS flip-flop is in the set state are applied to this counter 34. To that end the output of the clock pulse generator 19 is connected to a first input of an AND-gate 35 whose other input is connected to the Q output of the flip-flop 33. The output of this AND-gate 35 is further connected to the clock pulse input of the counter 34. The signal occurring at the Q-output of flip-flop 33 is now applied to the read circuit F of each of the RAM's and the signal occurring at the $\bar{Q}$-output of this flipflop 33 is now applied to the write circuit E of the RAM's.

As mentioned above it is assumed for the embodiments shown in the FIGS. 2 and 6 that N is an even integer. The inventive idea is, however, also applicable to a decimation filter having an odd filter length. In this case one of the distribution lines may then be considered to be the symmetry line. Therefore, this distribution line will not be connected to an adder device. Furthermore, the first delay line will now be assembled from (N−q)/2q and the second delay line from (N−3q)/2q auxiliary delay lines, or vice versa.

Figure 9:
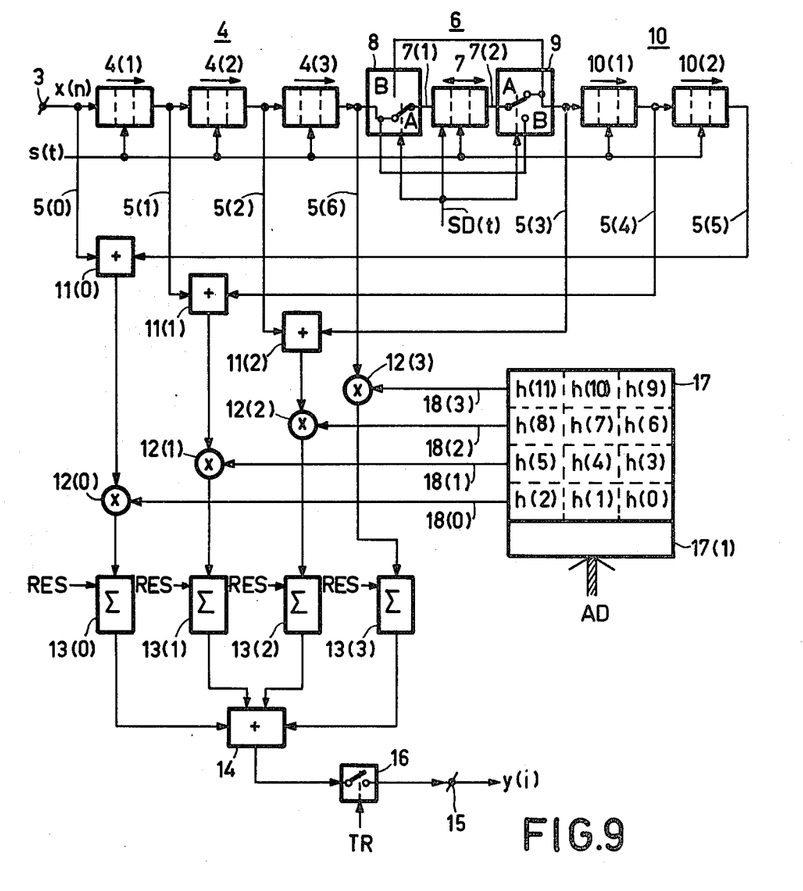
FIG. 9 shows an embodiment of a decimation linear phase digital filter having a filter length N which is odd.

For completeness, FIG. 9 shows an embodiment of a decimation filter having a linear phase characteristic whose filter length N is odd and equal to 21. The embodiment shown in FIG. 10 corresponds for the greater part with the embodiment shown in FIG. 2 but differs therefrom in the following respects:

The shift register 4 now comprises three auxiliary shift registers 4(1), 4(2), 4(3) and the shift register 10 comprises again two auxiliary shift registers.

The output of the auxiliary shift register 4(3) is connected directly to the input of a second multiplier device 12(3). A sequence of q filter coefficients is also applied to this multiplier device 12(3), namely the sequence $h(kq+q-r)$, wherein k=3 and r=1, 2, 3. Also these filter coefficients are generated by the storage medium 17, which comprises a fourth output 18(3) through which these filter coefficients are applied to the multiplier device 12(3).

The output of the multiplier device 12(3) is connected to the input of a fourth accumulator 13(3) which, just as the accumulators 13(0)–13(2), comprises a resetting input RES, an output of this fourth accumulator 13(3) being connected to a fourth input of the adder device 14.

Figure 10:
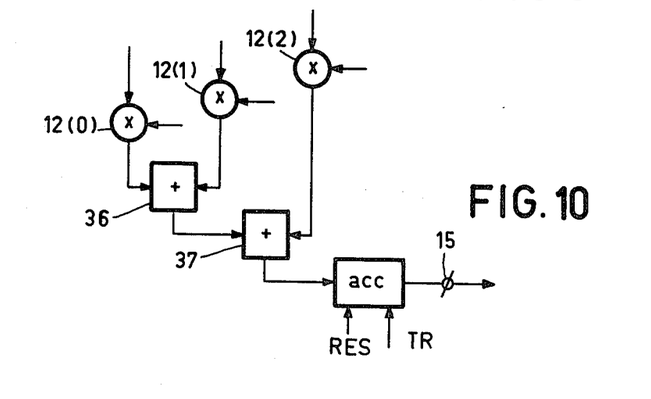
FIG. 10 shows a circuit configuration for use in the digital filter shown in the FIGS. 2 and 3 and arranged to determine the sum of all the numbers occurring on parallel lines in a predetermined time interval.

In the decimation filters shown in the FIGS. 2, 6 and 9 the circuit which forms the algebraic sum of the expression (6) and which applies this sum as the output signal sample y(i) to the filter input 15 is formed by a number of accumulators 13(.), one adder 14 and a switching device 16. A further embodiment of such a circuit is shown in FIG. 10 for the cases shown in FIGS. 2 and 6, wherein three multiplying devices are used and comprises a first adder device 36, which sums the products produced by the multiplying devices 12(0) and 12(1). It comprises a second adder device 37 forming the sum of the numbers produced by the first adder device 36 and the multiplying device 12(2). The numbers produced by this second adder device 37 are accumulated in an accumulator 38. The content of this accumulator 38 is read under the control of the pulses TR and applied to the filter output 15. Under the control of the pulse RES, this accumulator 38 is reset to the zero position.

What is claimed is:
1. A decimation, non-recursive digital linear phase FIR filter with length N and decimation factor q, wherein N and q are integers, characterized by:
a filter input to which components of a digital input signal are applied at a rate 1/T, and a filter output;
a first digital delay line connected to the filter input;
a second digital delay line, said first and second digital delay lines each being provided by a cascade arrangement of a number of auxiliary delay lines, each having a time delay qT, individual distribution lines being connected, respectively, to the inputs of said first and second digital delay lines as well as to the outputs of the auxiliary delay lines forming said first and second digital delay lines;
a control circuit having means for generating first and second control pulses, wherein every two consecutive first control pulses defines a control interval having a length qT;
a sequence reversing device, for coupling the output of the first digital delay line to the input of the second digital delay line, comprising storage means for storing those q components which occur se- quentially in a control interval at the output of the first digital delay line, and means, in response to said first control pulses, for applying sequentially and in the reverse order these q components in the next control interval, to the input of the second digital delay line;

first adder means for respectively coupling distribution lines which are located symmetrically relative to a symmetry line, for forming sum components;

means for producing in each control interval a plurality of filter coefficients;

multiplying means coupled respectively to the first adder means and to the means producing the filter coefficients, for generating product components each one of which is formed by the product of a sum component and a filter coefficient associated therewith;

second adder means for adding together the product components produced in a control interval; and means controlled by the said second control pulses for periodically coupling, with a period $qT$, the filter output to the second adder means.

2. A decimation filter as claimed in claim 1, characterized in that each of the auxiliary delay lines of said first and second digital delay lines is provided by a forward shift register consisting of q shift register sections which are each arranged for storing a component of the digital input signal.

3. A decimation filter as claimed in claim 1 or 2, characterized in that in the sequence reversing device said storage means comprises a reversable shift register having q shift register sections each arranged for storing a component of the digital input signal, and said applying means comprises switching means for coupling this reversable shift register to the output of the first digital delay line and to the input of the second digital delay line, and means for applying the first control pulses to the said switching means.

4. A decimation filter as claimed in claim 1, characterized in that:

each of the auxiliary delay lines comprises a cascade arrangement of a buffer for storing one input signal component and a store having q addressable storage locations each arranged for storing an input signal component, each of these stores comprising an address decoder;

and said filter further comprises means for generating storage locations address codes, and means for applying these storage location address codes to the said address decoders.

5. A decimation filter as claimed in claim 1 or 4, characterized in that:

the sequence reversing device comprises a cascade arrangement of a buffer for storing one input signal component and a store having q addressable storage locations which are arranged for storing an input signal component, this store comprising an address decoder, means controlled by said first control pulses and arranged for selectively converting each one of the storage location address codes to be applied to the address decoder into their one's complement value, and means for applying said storage location address codes to said selective converting means.

* * * * *